(12) United States Patent
Zhang et al.

(10) Patent No.: US 10,595,420 B2
(45) Date of Patent: Mar. 17, 2020

(54) ENCAPSULATION STRUCTURE AND DISPLAY APPARATUS

(71) Applicants: BOE TECHNOLOGY GROUP CO., LTD., Beijing (CN); ORDOS YUANSHENG OPTOELECTRONICS CO., LTD., Ordos (CN)

(72) Inventors: Liang Zhang, Beijing (CN); Fuyi Cui, Beijing (CN); Shanshan Bao, Beijing (CN)

(73) Assignees: BOE TECHNOLOGY GROUP CO., LTD, Beijing (CN); ORDOS YUANSHENG OPTOELECTRONICS CO., LTD, Ordos (CN)

( * ) Notice: Subject to any disclaimer, the term of this patent is extended or adjusted under 35 U.S.C. 154(b) by 155 days.

(21) Appl. No.: 15/534,405

(22) PCT Filed: Dec. 27, 2016

(86) PCT No.: PCT/CN2016/112381
§ 371 (c)(1),
(2) Date: Jun. 8, 2017

(87) PCT Pub. No.: WO2017/152700
PCT Pub. Date: Sep. 14, 2017

(65) Prior Publication Data
US 2018/0110136 A1  Apr. 19, 2018

(30) Foreign Application Priority Data
Mar. 11, 2016 (CN) .................. 2016 2 0187950 U

(51) Int. Cl.
*H05K 5/00* (2006.01)
*H05K 1/02* (2006.01)
(Continued)

(52) U.S. Cl.
CPC ......... *H05K 5/0017* (2013.01); *H05K 1/0201* (2013.01); *H05K 1/0274* (2013.01);
(Continued)

(58) Field of Classification Search
CPC ............ H01L 27/3276; H01L 51/5246; H05K 1/0201; H05K 2201/10128; H05K 5/0017; H05K 5/065; H05K 5/069
See application file for complete search history.

(56) References Cited

U.S. PATENT DOCUMENTS 9,349,983 B2  5/2016  Cho et al.
2004/0119403 A1*  6/2004  McCormick ........ H01L 51/5203
                                                                  313/506
(Continued)

FOREIGN PATENT DOCUMENTS

CN  204011490 U  12/2014
CN  104425762 A  3/2015
(Continued)

OTHER PUBLICATIONS

The World Intellectual Property Organization (WIPO) International Search Report and Written Opinion for PCT/CN2016/112381 dated Mar. 22, 2017 12 Pages.
(Continued)

*Primary Examiner* — William H. Mayo, III
*Assistant Examiner* — Rhadames Alonzo Miller
(74) *Attorney, Agent, or Firm* — Anova Law Group, PLLC

(57) ABSTRACT

An encapsulation structure and a related display apparatus are provided. The encapsulation structure includes a first substrate having a sealing region; a metal pattern on the sealing region; a thermal conductive layer, at least covering the metal pattern and electrically insulated from the metal pattern; and a sealing structure on the thermal conductive layer.

20 Claims, 2 Drawing Sheets

(51) Int. Cl.
  *H05K 5/03* (2006.01)
  *H05K 5/06* (2006.01)
  *H05K 7/20* (2006.01)
  *H05K 1/03* (2006.01)

(52) U.S. Cl.
  CPC .............. *H05K 5/03* (2013.01); *H05K 5/065* (2013.01); *H05K 5/069* (2013.01); *H05K 7/20963* (2013.01); *H05K 1/0306* (2013.01); *H05K 1/0313* (2013.01); *H05K 2201/10128* (2013.01)

(56) References Cited

U.S. PATENT DOCUMENTS

| | | | |
|---|---|---|---|
| 2005/0094394 A1* | 5/2005 | Padiyath | H01L 27/3293 362/249.01 |
| 2005/0095736 A1* | 5/2005 | Padiyath | H01L 51/0021 438/22 |
| 2005/0156512 A1* | 7/2005 | Savvateev | H01L 51/5203 313/503 |
| 2011/0241541 A1 | 10/2011 | Liu et al. | |
| 2014/0027743 A1 | 1/2014 | Nishido | |
| 2015/0060789 A1* | 3/2015 | Cho | H01L 51/5234 257/40 |
| 2016/0254485 A1* | 9/2016 | Song | H01L 51/56 257/40 |

FOREIGN PATENT DOCUMENTS

| | | |
|---|---|---|
| CN | 205582942 U | 9/2016 |
| WO | 2008103338 A1 | 8/2008 |
| WO | 2015196600 A1 | 12/2015 |

OTHER PUBLICATIONS

The European Patent Office (EPO) The Extended European Search Report for 16871755.1, dated Oct. 11, 2019 8 Pages.

* cited by examiner

ENCAPSULATION STRUCTURE AND DISPLAY APPARATUS

CROSS-REFERENCES TO RELATED APPLICATIONS

This application is a national phase entry under 35 U.S.C. § 371 of International Application No. PCT/CN2016/112381, filed on Dec. 27, 2016, which claims priority to Chinese Patent Application No. 201620187950.4, filed on Mar. 11, 2016, the entire contents of both of which are incorporated by reference herein.

TECHNICAL FIELD

The present disclosure generally relates to display technologies and, more particularly, relates to an encapsulation structure, and a related display apparatus.

BACKGROUND

Currently, the double-layer frit plastic encapsulation technique is generally used in the encapsulating processes for photovoltaic devices, plasma display devices, organic light emitting diode (OLED) devices, and active matrix organic light emitting diode (AMOLED) devices.

In conventional encapsulating processes for display panel devices, the frit plastic under the encapsulating cover substrate may directly cover metal wirings used to lead the connection terminals of the internal circuits out to external circuits. Because thermal conductivities of the metal wirings and the substrate material used for the display panel devices often have large differences, during the laser sealing process, an uneven heating of the frit plastic may occur, where a large amount of gas bubbles may be generated with uneven widths of the laser sealing. Consequently, uneven internal stresses may be generated within the sealing structure for encapsulation. Eventually, the sealing structure formed by solidifying the frit plastic may be easily broken.

The disclosed encapsulation structure and display apparatus are directed to at least partially alleviate one or more problems set forth above and to solve other problems in the art.

BRIEF SUMMARY

In accordance with embodiments of the present disclosure, an encapsulation structure, and a related display apparatus are provided.

An aspect of the present disclosure provides an encapsulation structure. The encapsulation structure includes a first substrate having a sealing region; a metal pattern on the sealing region; a thermal conductive layer, at least covering the metal pattern and electrically insulated from the metal pattern; and a sealing structure on the thermal conductive layer.

Optionally, the thermal conductive layer has a projected area on the metal pattern with a circumference that substantially encloses the metal pattern in the sealing region.

Optionally, the thermal conductive layer includes at least one via hole there-through; and a portion of the sealing structure is formed in the at least one via holes.

Optionally, the sealing structure is formed from a frit plastic on the sealing region by a laser sealing process.

Optionally, the thermal conductive layer is made of an electrically-insulating material including one or more of a thermal silicone, a thermal grease, and polyimide.

Optionally, the thermal conductive layer is made of an electrically-conductive material, An insulating layer is between the thermal conductive layer and the metal pattern.

Optionally, the electrically-conductive material includes a metallic material including at least one of molybdenum, aluminum, gold, silver, copper, a molybdenum alloy, an aluminum alloy, a gold alloy, a silver alloy, and a copper alloy.

Optionally, the insulating layer is made of a material including one or more of silicon nitride, silicon oxide, and a refractory organic insulating material.

Optionally, the insulating layer is a colored insulating layer used for blocking the metal pattern from an incident light.

Optionally, the thermal conductive layer includes at least one via hole, and the sealing structure is in contact with the insulating layer through the at least one via hole.

Optionally, the thermal conductive layer has a surface away from the metal pattern and in parallel with a surface plane of the first substrate.

Optionally, the first substrate is one of an array substrate, a touch panel, a glass substrate, a color filter substrate, and glass cover substrate.

Optionally, a second substrate is on the sealing structure.

Optionally, the sealing structure in the sealing region has a first surface in contact with the thermal conductive layer and a second surface in contact with the second substrate, and the first and second surfaces are on opposite sides of the sealing structure.

Optionally, the first substrate, the second substrate, and the sealing region are configured to encapsulate a substantially-closed region.

Optionally, the metal pattern is a portion of metal wirings falling in the sealing region. The metal wirings are extended from the substantially-closed region, across the sealing region, and to outside of the sealing region.

Optionally, the metal pattern, the thermal conductive layer, and the sealing structure form a first portion of the sealing region, and the sealing region further includes a second portion free of the metal pattern and remain the thermal conductive layer and the sealing structure.

Optionally, the second portion of the sealing region further includes an insulating layer between the thermal conductive layer and the first substrate, when the thermal conductive layer is made of an electrically-conductive material.

Another aspect of the present disclosure provides a display apparatus including the disclosed encapsulation structure.

Other aspects of the present disclosure can be understood by those skilled in the art in light of the description, the claims, and the drawings of the present disclosure.

BRIEF DESCRIPTION OF THE DRAWINGS

Various objects, features, and advantages of the present disclosure can be more fully appreciated with reference to the following detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solutions of present disclosure, reference will now be made in detail to exemplary embodiments of the present disclosure, which are illustrated in the accompanying drawings. Wherever possible, the same reference numbers will be used throughout the drawings to refer to the same or like parts.

Various embodiments provide an encapsulation structure and a related display apparatus. An exemplary encapsulation structure may include a first substrate having a sealing region; a metal pattern on the sealing region; a thermal conductive layer, at least covering the metal pattern and electrically insulated from the metal pattern; and a sealing structure on the thermal conductive layer. To form the encapsulation structure, a second substrate, also referred to as a counter substrate, may be placed on the sealing structure.

The thermal conductive layer may be made of an electrically-insulating material or an electrically-conductive material. While the electrically-conductive material is used, an insulating layer is formed between the thermal conductive layer and the metal pattern.

In some embodiments, the insulating layer is a colored insulating layer used for blocking the metal pattern from being exposed to an incident light.

In some embodiments, the thermal conductive layer includes via hole(s) to allow connections between the sealing structure and the insulating layer through the via hole(s) to further improve adhesions between components in the encapsulation structure.

The first substrate, such as the substrate 10 in FIGS. 1-2 and 4-5, may be one of an array substrate, a touch panel, a glass substrate, a color filter substrate, and glass cover substrate. The second substrate, such as the counter substrate 20 in FIGS. 2 and 4-5, may be placed on the sealing structure.

The metal pattern may be a portion of metal wirings, metal pads, and/or metal terminals that fall at the sealing region. Those metal wirings, metal pads, and/or metal terminals may be extended from the to-be-encapsulated region, across the sealing region, and to outside of the sealing region for external electrical connections.

As such, one certain embodiment may be directed to improve a metal pattern of integrated circuit (IC) leads that on one side corresponding to the frit plastic. A colored insulating material can be formed to cover the IC metal wirings. Metal patterns can be on a colored insulating material. The frit plastic can undergo a consistent heating during the laser sealing process.

Figure 1:
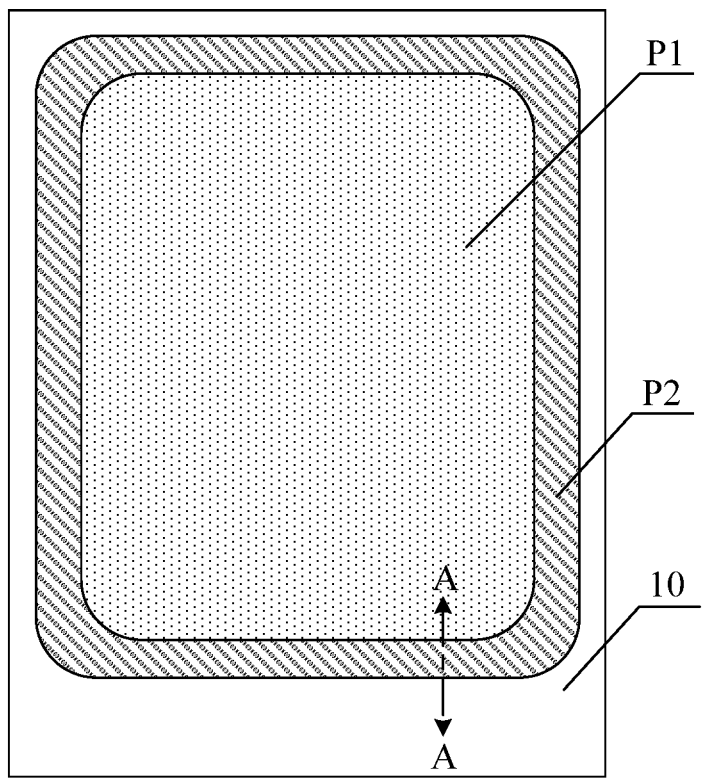
FIG. 1 illustrates a top view of an exemplary encapsulation structure in accordance with some embodiments of the disclosed embodiments.
Figure 2:
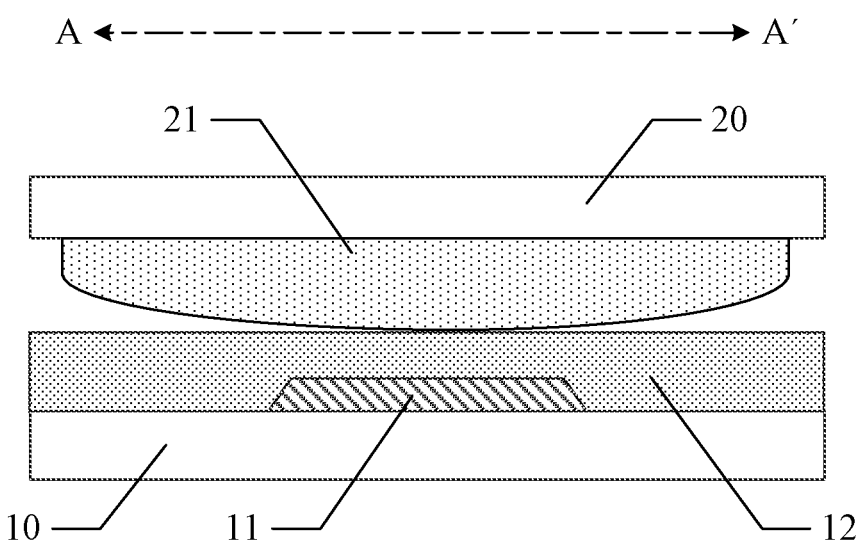
FIG. 2 illustrates a cross-sectional view along an A-A' direction of the encapsulation structure shown in FIG. 1 in accordance with some embodiments of the disclosed embodiments.

FIG. 1 illustrates a top view of an exemplary encapsulation structure in accordance with some embodiments of the present disclosure, and FIG. 2 is a cross-sectional view along an A-A' direction of the encapsulation structure shown in FIG. 1 that has been encapsulated with a counter substrate.

In FIG. 1, a substrate 10 is provided. The substrate 10 may include different regions, for example, a to-be-encapsulated region P1 and a sealing region P2 surrounding the to-be-encapsulated region P1.

In FIG. 2, a sealing structure 21 may be formed on the sealing region P2 of the substrate 10. The sealing structure 21 may be formed by performing a laser sealing process on a frit plastic. The sealing structure 21, the substrate 10, and a counter substrate 20 may form an exemplary encapsulation structure.

Metal wirings may be configured over/on a surface of the substrate 10 and across the sealing region P2 of the substrate 10. For example, a length portion of the metal wirings may be directly above the sealing region P2 and providing a metal pattern 11 on the sealing region. A thermal conductive layer 12 may be formed to at least cover the metal pattern 11. The thermal conductive layer 12 and the metal pattern 11 may be electrically insulated from each other.

The substrate 10 may include any suitable substrate having a region that needs to be encapsulated, i.e., having a to-be-encapsulated region. The to-be-encapsulated region of the substrate may be encapsulated by a sealing structure disposed on the sealing region P2 of the substrate. The sealing structure can be formed by performing a laser sealing process on a frit plastic. A metal pattern may be between the substrate and the sealing structure.

In one embodiment, the substrate may include an array substrate and the to-be-encapsulated region may be a display region. A sealing region may surround the display region. Metal wirings connected to the connection terminals of display circuits in the to-be-encapsulated region may be used to make a connection with external connections. The metal wirings may be configured over the substrate, across the sealing region of the substrate, and having a metal pattern on the sealing region.

In another embodiment, the substrate may include a touch panel and the to-be-encapsulated region may be a touching region. A sealing region may surround the touching region. Metal wirings connected to the connection terminals of touch and control circuits in the to-be-encapsulated region may be used to make a connection with external connections. The metal wirings may be configured over the substrate, across the sealing region of the substrate, and having a metal pattern on the sealing region.

In yet another embodiment, the substrate may include a glass substrate and the to-be-encapsulated region may be a region for forming or configuring semiconductor device(s). A sealing region may surround the semiconductor device region. Metal wirings connected to electrodes of semiconductor device(s) in the to-be-encapsulated region may be used to make a connection with external connections. The metal wirings may be configured over the substrate, across the sealing region of the substrate, and having a metal pattern on the sealing region.

In yet another embodiment, the substrate may include a color filter substrate or a glass cover substrate, and the to-be-encapsulated region may include any suitable conductive patterns, such as metal patterns. A sealing region may surround the conductive patterns. Metal wirings connected to the conductive patterns in the to-be-encapsulated region may be used to make a connection with external connections. The metal wirings may be configured over the substrate, across the sealing region of the substrate, and having a metal pattern on the sealing region.

It should be noted that, conventional array substrate, touch panel, glass substrate, color filter substrate, or glass cover substrate, does not include the disclosed thermal conductive layer there-over, and corresponding sealing structure on the metal wirings may have defects.

Figure 3:
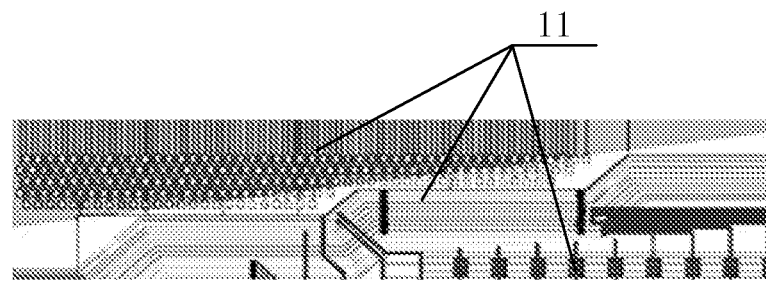
FIG. 3 illustrates a surface structure of an existing substrate at a sealing region.

For example, FIG. 3 is a surface view of an existing substrate at a sealing region. As illustrated, the substrate is a glass substrate. Multiple metal patterns 11 in a form of metal wirings, metal pads, and metal terminals, and other structures are disposed on the surface of the sealing region of the glass substrate. Because the metal pattern 11 have a thermal conductivity much higher than the glass material, during the laser sealing process performed on a frit plastic for forming the sealing structure, it is difficult to uniformly distribute thermal energy over the surface as illustrated in FIG. 3. Significant temperature differences may occur between different locations of the surface illustrated in FIG. 3. A large amount of gas bubbles may be generated on the intersections of the metal patterns on the glass substrate. The gas bubbles may cause uneven widths of the laser sealing and non-uniform stresses within the sealing structure. Therefore, at locations illustrated in FIG. 3, the defects within the sealing structure may cause the sealing structure to be broken in a hot and humid environment, resulting in a failure of the encapsulation.

Referring back to FIG. 2, in some embodiments of the present disclosure, a thermal conductive layer 12 may cover at least the metal pattern 11, in the sealing region. Thus, a thermally conducting interface can be formed between the metal pattern 11 and the sealing structure 21 in the sealing region. During the laser sealing process performed on a frit plastic for forming the sealing structure, the heat can be uniformly distributed over the thermal conducting interface. The defects within the sealing structure due to large temperature differences can be eliminated. Further, since the thermal conductive layer 12 is electrically insulated from the metal pattern 11, the metal pattern 11 on the substrate can maintain the original circuit connection. Therefore, the disclosed encapsulation structure can solve the problem that the sealing structure on the metal pattern has defects, and can also improve the sealing performance of the frit plastic, and can further improve the product reliability.

It should be noted that, FIGS. 1 and 2 are illustrated only as an example. The present disclosure may be applicable regardless of any of the following factor(s): the shape and type of the substrate; whether a to-be-encapsulated region P1 is setup; whether a counter substrate 20 is provided; the location and shape of the encapsulated region P1; the particular shape of the metal pattern 11 and the circuit connection relationship; the shape of the sealing structure; and the shape of the thermal conductive layer 12.

Further, in some embodiments, the thermal conductive layer 12 can be formed using a high-temperature-resistant thermal-conducting electrical-insulating material, such as thermal silicone, thermal grease, polyimide, etc.

The thermal conductive layer 12 may be a single layer structure covering the metal pattern 11 as illustrated in FIG. 2. The single layer structure can provide a thermal conducting interface during the laser sealing process performed on a frit plastic for forming the sealing structure. It can be understood that, the single layer structure means a low production cost because of the simple structure. The thermal conductive layer 12 having a single layer structure can improve the encapsulation performance and can also reduce the production cost.

In various embodiments, a region for forming the thermal conductive layer 12 may overlap with a region for forming the metal pattern 11, and may also overlap with the entire sealing region P2. The thermal conductive layer 12 may have a projected area on the metal pattern 11 with a circumference to substantially enclose the metal pattern 11 that is in the sealing region P2.

For example, as shown in FIG. 2, the thermal conductive layer 12 may envelop the metal pattern 11, together formed on the substrate 10. The thermal conductive layer 12 enveloping the metal pattern 11 may have a width greater than a width of the metal pattern 11. In another example, as shown in FIG. 4, the thermal conductive layer 12 may be formed over the metal pattern 11 and have a width greater than a width of the metal pattern 11.

In various embodiments, the thermal conductive layer 12 in the sealing region P2 may have a width greater than or substantially equal to the width of the sealing region P2. In some cases, the thermal conductive layer 12 in the sealing region P2 may have a width less than the sealing region P2 and greater than the metal pattern 11. The upper surface of the thermal conductive layer 12 may be in parallel with a surface plane such as a top surface of the substrate 10, and may also comply with a profile of the upper surface of the metal pattern.

Figure 4:
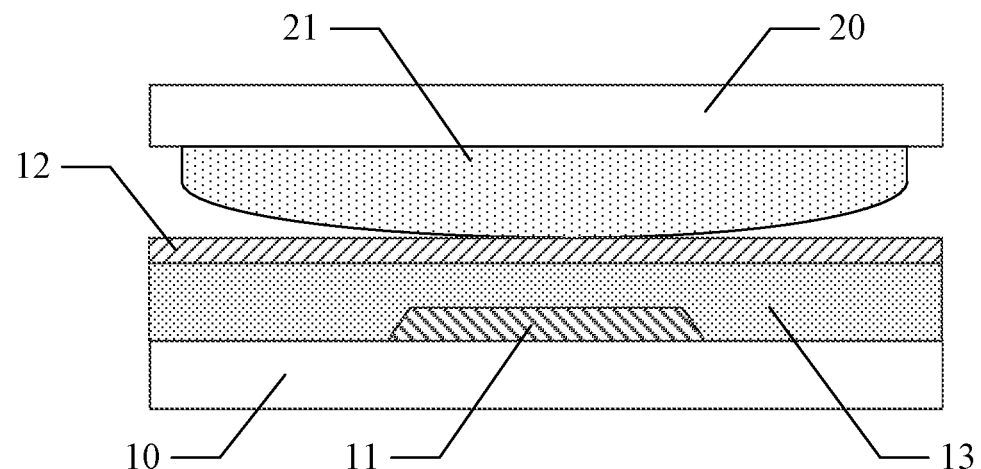
FIG. 4 illustrates a cross-sectional view of an exemplary encapsulation structure at a sealing region in accordance with some embodiments of the disclosed embodiments.

FIG. 4 illustrates a cross-sectional view of an exemplary encapsulation structure at a sealing region in accordance with some embodiments of the present disclosure.

Different from the structure shown in FIG. 2, in some embodiments, the thermal conductive layer 12 illustrated in FIG. 4 can be formed by using a metallic material, and a thickness of the thermal conductive layer 12 can be in a range of about 1000, to about 5000 Å. An insulating layer 13 is formed between the thermal conductive layer 12 and the metal pattern 11 for electrically insulating the thermal conductive layer 12 from the metal pattern 11. A thickness of the insulating layer 13 can be in a range of about 3000 Å to about 30000 Å.

The processes of forming the thermal conductive layer 12 and the insulating layer 13 may be integrated into the production process of the substrate. For example, when the substrate is a thin film transistor (TFT) array substrate, the metal pattern 11 and a gate metal layer can be formed in a same, single patterning process, while the insulating layer 13 may be formed from the gate insulating layer, and the thermal conductive layer 12 and a source and drain metal layer can be formed in a same, single patterning process. Therefore, the substrate illustrated in FIG. 4 can be formed by adapting the patterning processes without additional steps. The materials used for the thermal conductive layer 12 or the insulating layer 13 may be consistent with the materials used for the corresponding structure formed in a same patterning process for the thermal conductive layer 12 or the insulating layer 13.

In order to meet both the high thermal conductivity requirement and the high temperature resistance requirement, the metallic material can be selected from any suitable single element metal including, for example, molybdenum, aluminum, gold, silver, and copper, or can be selected from any suitable metal alloy including, for example, molybdenum alloy, aluminum alloy, gold alloy, silver alloy, and copper alloy.

In order to meet both the insulation requirement and the high temperature stability requirement, the material of the insulating layer 13 can be selected from silicon oxide, silicon nitride, any suitable metal oxides, and/or any suitable refractory organic insulating material.

Further, the material of the insulating layer 13 may be a colored insulating material. The insulating layer 13 formed by the colored insulating material can block the structures under the insulating layer 13 from being exposed to the incident light, which can avoid the negative effects to the circuits from the incident light, and can also improve the appearance.

In order to further enhance the sealing properties of the frit plastic, a layered structure filling the sealing region can be formed by using a combination of the insulating layer 13 and the thermal conducting layer 12. One side of the layered structure that is away from the metal pattern 11 can be in parallel with a top surface of the substrate. Specifically, the layered structure can be realized by using at least the following two exemplary methods.

In one example, the insulating layer 13 may be used as a planarization layer in the sealing area. The thermal conductive layer 12 that has a same thickness of the insulating layer 13 can be formed on the insulating layer 13 by using a metallic material.

In another example, the insulating layer 13 may be formed in any suitable manner to cover the metal pattern 11. For example, the insulating layer 13 may be formed to merely cover the metal pattern 11. Then, the thermal conductive layer 12 having an upper surface in parallel with the top surface of the substrate can be formed by using a metallic material.

Therefore, a flat surface may be provided in the sealing region for forming the sealing structure. For example, the flat surface may enhance uniformity of the frit plastic placed thereon, and may also provide a flat integration between the substrate and the counter substrate.

As disclosed, the thermal conductive layer may have a projected area, projected on the metal pattern. The projected area may have a circumference that substantially encloses the metal pattern, e.g., encloses an entire surface area of the metal pattern, that is in the sealing region. In various embodiments, the thermal conductive layer may be a patterned layer and may include one or more via holes through the thermal conductive layer. When the sealing structure is formed over the metal pattern, in the case with or without the insulating layer, a portion of the sealing structure may be formed in the one or more via holes.

Figure 5:
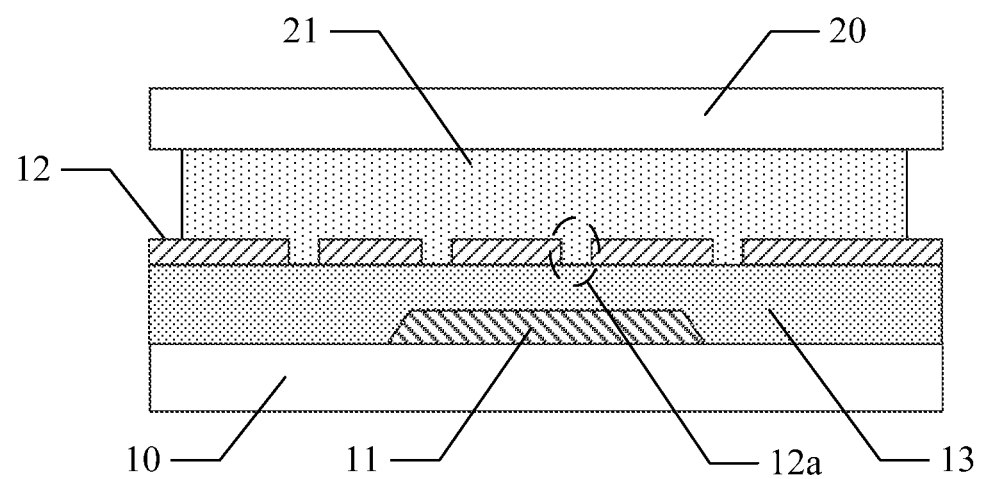
FIG. 5 illustrates a cross-sectional view of another exemplary encapsulation structure at a sealing region in accordance with some embodiments of the disclosed embodiments.

For example, referring to FIG. 5, a cross-sectional view of another exemplary encapsulation structure in a sealing region is illustrated in accordance with some other embodiments of the present disclosure.

As illustrated, at least one via hole 12a is formed in the thermal conductive layer 12. The at least one via hole 12a can allow the sealing structure 21 formed in the sealing region in contact with the insulating layer 13 exposed by the at least one via hole 12a.

Comparing with the sealing structure 21 shown in FIG. 4 that is not in contact with the insulating layer 13, the at least one via hole 12a can be used to enhance the adhesive reliability between the sealing structure 21 and the substrate 10, This can facilitate to avoid stripping off of the thermal conductive layer 12 together with the sealing structure 21 from the substrate 10 by an external force.

It should be noted that, the via holes 12a shown in FIG. 5 are used only for example. The number, size, and location of the at least one via hole 12a can be determined in accordance with required binding extent between the sealing structure and the substrate.

As such, the first substrate, the second substrate, and the sealing region may be configured to encapsulate a substantially-closed region. In other words, the to-be-encapsulated P1 may be a substantially-closed region encapsulated according to the structures and methods provided in the present disclosure.

Additionally, note that FIGS. 2 and 4-5 merely illustrate a first portion of the sealing region, which includes the metal pattern, the thermal conductive layer, the insulating layer, and/or the sealing structure. However, the disclosed sealing region may further include a second portion that is free of the metal pattern. Without having the metal pattern, other layers in the second portion may remain the same as in the first portion of the sealing region.

For example, the thermal conductive layer, the insulating layer, and/or the sealing structure may each be a single layer included in both the first and the second portions of the sealing region, while the insulating layer may be optional. In one embodiment, when the thermal conductive layer is made of an electrically-conductive material, the insulating layer may be between the thermal conductive layer and the first substrate.

Another aspect of the present disclosure provides a related display apparatus that includes any one of substrates described above. The display apparatus can include any suitable type of display device, such as a flat panel display device or a flexible display device. The display apparatus can include any suitable type of display panel, such as a LCD panel or an OLEO panel. Specific types of the display apparatus can include monitor, electronic paper, tablet computer, television, smart phone, smart tag, smart card, smart glasses, smart watch, digital photo frame, etc.

Because the disclosed display apparatus includes the disclosed encapsulation structure, the disclosed display apparatus may include the sealing structure without any defects on the metal pattern, and may also include improved sealing performance of the frit plastic, and may further improve the product reliability.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a substrate and a related display apparatus are provided.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure, which is only limited by the claims which follow. Features of the disclosed embodiments can be combined and rearranged in various ways.

Without departing from the spirit and scope of the present disclosure, modifications, equivalents, or improvements to the present disclosure are understandable to those skilled in the art and are intended to be encompassed within the scope of the present disclosure.

What is claimed is:

1. An encapsulation structure, comprising:
   a first substrate having a sealing region;
   a metal pattern disposed on a first surface of the sealing region of the first substrate;
   a thermal conductive layer, fully covering a top surface of the metal pattern facing to the thermal conductive layer and side surfaces of the metal pattern, wherein:
   at least a portion of the thermal conductive layer is electrically insulated from the metal pattern, and the thermal conductive layer contacts a second surface of the sealing region of the first substrate; and
a sealing structure on the thermal conductive layer.

2. The encapsulation structure according to claim 1, wherein:
the thermal conductive layer has a projected area on the metal pattern with a profile that substantially encloses the metal pattern in the sealing region.

3. The encapsulation structure according to claim 2, wherein:
the thermal conductive layer includes at least one hole formed by cutting off a portion of the thermal conductive layer; and
a portion of the sealing structure is formed within the at least one hole.

4. The encapsulation structure according to claim 1, wherein:
the sealing structure is formed from a frit plastic on the sealing region by a laser sealing process.

5. The encapsulation structure according to claim 1, wherein:
the thermal conductive layer is made of an electrically-insulating material including one or more of a thermal silicone, a thermal grease, or polyimide.

6. The encapsulation structure according to claim 1, wherein:
a portion of the thermal conductive layer includes an electrically-conductive material layer.

7. The encapsulation structure according to claim 6, wherein:
the thermal conductive layer further includes an insulating layer between the electrically-conductive material layer and the metal pattern.

8. The encapsulation structure according to claim 7, wherein:
the electrically-conductive material layer includes a metallic material including at least one of molybdenum, aluminum, gold, silver, copper, a molybdenum alloy, an aluminum alloy, a gold alloy, a silver alloy, or a copper alloy.

9. The encapsulation structure according to claim 7, wherein:
the insulating layer is made of a material including one or more of silicon nitride, silicon oxide, or a refractory organic insulating material.

10. The encapsulation structure according to claim 7, wherein:
the insulating layer is a colored insulating layer configured for blocking the metal pattern from an incident light.

11. The encapsulation structure according to claim 7, wherein:
the electrically-conductive material layer includes at least one via hole, and the sealing structure is in contact with the insulating layer through the at least one via hole.

12. The encapsulation structure according to claim 1, wherein:
the thermal conductive layer has a surface away from the metal pattern and in parallel with a surface plane of the first substrate.

13. The encapsulation structure according to claim 1, wherein:
the first substrate is one of an array substrate, a touch panel, a glass substrate, a color filter substrate, and glass cover substrate.

14. The encapsulation structure according to claim 1, further including:
a second substrate on the sealing structure.

15. The encapsulation structure according to claim 14, wherein:
the sealing structure in the sealing region has a first surface in contact with the thermal conductive layer and a second surface in contact with the second substrate, and
the first and second surfaces of the sealing structure are on opposite sides of the sealing structure.

16. The encapsulation structure according to claim 14, wherein:
the first substrate, the second substrate, and the sealing region are configured to encapsulate a substantially-closed region.

17. The encapsulation structure according to claim 16, wherein:
the metal pattern is a portion of metal wirings located and defined in the sealing region, wherein the metal wirings are extended from the substantially-closed region, across the sealing region, and to outside of the sealing region.

18. The encapsulation structure according to claim 1, wherein:
the metal pattern, the thermal conductive layer, and the sealing structure form a first portion of the sealing region, and
the sealing region further includes a second portion free of the metal pattern, the thermal conductive layer and the sealing structure being extended to the second portion of the sealing region on the first substrate.

19. The encapsulation structure according to claim 18, wherein:
the second portion of the sealing region further includes an insulating layer between the thermal conductive layer and the first substrate, when the thermal conductive layer is made of an electrically-conductive material.

20. A display apparatus, comprising the encapsulation structure according to claim 1.

* * * * *